(12) United States Patent
Meng et al.

(10) Patent No.: US 12,174,063 B2
(45) Date of Patent: Dec. 24, 2024

(54) SAMPLING CIRCUIT, OPTICAL DETECTION SYSTEM, DISPLAY APPARATUS AND SAMPLING METHOD

(71) Applicants: Beijing BOE Optoelectronics Technology Co., Ltd., Beijing (CN); BOE TECHNOLOGY GROUP CO., LTD., Beijing (CN)

(72) Inventors: Zhaohui Meng, Beijing (CN); Lianghao Zhang, Beijing (CN); Xinle Wang, Beijing (CN); Wenchao Han, Beijing (CN); Wei Sun, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/912,888

(22) PCT Filed: Oct. 29, 2021

(86) PCT No.: PCT/CN2021/127295
§ 371 (c)(1),
(2) Date: Sep. 20, 2022

(87) PCT Pub. No.: WO2022/222409
PCT Pub. Date: Oct. 27, 2022

(65) Prior Publication Data
US 2024/0210239 A1 Jun. 27, 2024

(30) Foreign Application Priority Data

Apr. 23, 2021 (CN) .......................... 202110440663.5

(51) Int. Cl.
*G01J 1/44* (2006.01)
*G01R 15/04* (2006.01)
*G01R 19/00* (2006.01)

(52) U.S. Cl.
CPC ................ *G01J 1/44* (2013.01); *G01R 15/04* (2013.01); *G01R 19/0038* (2013.01)

(58) Field of Classification Search
CPC ........ G01J 1/44; G01R 15/04; G01R 19/0038
See application file for complete search history.

(56) References Cited

U.S. PATENT DOCUMENTS

2018/0262208 A1* 9/2018 Cao .................. H03M 11/02

FOREIGN PATENT DOCUMENTS

| CN | 105277834 A | 1/2016 |
|---|---|---|
| CN | 109164290 A | 1/2019 |

(Continued)

*Primary Examiner* — Kevin K Pyo
(74) *Attorney, Agent, or Firm* — HOUTTEMAN LAW LLC

(57) ABSTRACT

A sampling circuit, including a voltage divider circuit, a switch circuit and a comparator circuit; wherein first terminals of resistance voltage divider sub-circuits in the voltage divider circuit are electrically connected to voltage division output terminals, respectively, and the resistance voltage divider sub-circuits are configured to perform resistance voltage division processing according to the voltages at first and second input terminals and write divided voltages to the voltage division output terminals, respectively; the voltage division output terminals are electrically connected to the third input terminal through corresponding switch sub-circuits in the switch circuit, respectively, and each switch sub-circuit is configured to control connection/disconnection between a corresponding voltage division output terminal and the third input terminal; the comparator circuit is electrically connected to the sampling output terminal, and (Continued)

is configured to compare voltages at the third and fourth input terminals and provide comparison results to the sampling output terminal.

20 Claims, 5 Drawing Sheets

(56) References Cited

FOREIGN PATENT DOCUMENTS

| | | |
|---|---|---|
| CN | 111614230 A | 9/2020 |
| CN | 113155282 A | 7/2021 |
| JP | 2014204598 A | 10/2014 |

* cited by examiner

SAMPLING CIRCUIT, OPTICAL DETECTION SYSTEM, DISPLAY APPARATUS AND SAMPLING METHOD

TECHNICAL FIELD

The present disclosure relates to the field of signal processing, and particularly to a sampling circuit, an optical detection system, a display apparatus, and a sampling method.

BACKGROUND

In order to make a display product have more abundant functions, some manufacturers may integrate a light detection system into the display product, to detect ambient light and then implement various functions according to the detected ambient light, for example, to automatically adjust a screen according to the ambient light, so as to bring a better visual effect to a user.

The light detection system generally includes two parts: a light sensing circuit and a sampling circuit. The light sensing circuit senses light and generates a corresponding sampling voltage according to the light intensity, and the sampling circuit is used to sample the sampling voltage provided by the light sensing circuit. However, the sampling circuit in the related art has a complex circuit structure, an unstable sampling process and low sampling accuracy.

SUMMARY

The present disclosure is directed to at least one of the technical problems in the related art, and provides a sampling circuit, an optical detection system, a display apparatus and a sampling method.

In a first aspect, an embodiment of the present disclosure provides a sampling circuit, configured with a sampling voltage input terminal, a reference voltage input terminal, and a sampling output terminal, wherein the sampling circuit includes a voltage divider circuit, a switch circuit and a comparator circuit, the voltage divider circuit is configured with a first input terminal, a second input terminal and a plurality of voltage division output terminals, the second input terminal is electrically connected to a first power supply terminal, and the comparator circuit is configured with a third input terminal and a fourth input terminal;

the voltage divider circuit includes a plurality of resistance voltage divider sub-circuits sequentially connected in series between the first input terminal and the second input terminal and in a one-to-one correspondence with the plurality of voltage division output terminals, each of the plurality of resistance voltage divider sub-circuits is configured with a first terminal and a second terminal, the first terminal of a first resistance voltage divider sub-circuit in the plurality of resistance voltage divider sub-circuits is electrically connected to the first input terminal, the second terminal of a last resistance voltage divider sub-circuit in the plurality of resistance voltage divider sub-circuits is electrically connected to the second input terminal, the first terminals of the plurality of resistance voltage divider sub-circuits are electrically connected to the plurality of voltage division output terminals, respectively, and the plurality of resistance voltage divider sub-circuits are configured to perform resistance voltage division processing according to voltages at the first input terminal and the second input terminal and write divided voltages to the plurality of voltage division output terminals, respectively;

the switch circuit includes a plurality of switch sub-circuits in a one-to-one correspondence with the plurality of voltage division output terminals, the plurality of voltage division output terminals are electrically connected to the third input terminal through the plurality of switch sub-circuits, respectively, and each of the plurality of switch sub-circuits is configured to control connection and disconnection between a corresponding voltage division output terminal in the plurality of voltage division output terminals and the third input terminal;

the comparator circuit is electrically connected to the sampling output terminal, and is configured to compare voltages at the third input terminal and the fourth input terminal and provide comparison results to the sampling output terminal; and one of the first input terminal and the fourth input terminal is electrically connected to the sampling voltage input terminal, and the other of the first input terminal and the fourth input terminal is electrically connected to the reference voltage input terminal.

In some embodiments, the sampling circuit further includes a voltage regulator circuit, wherein the voltage regulator circuit includes at least one voltage regulator sub-circuit; and each of the at least one voltage regulator sub-circuit is electrically connected to one of the plurality of voltage division output terminals except the voltage division output terminal corresponding to the first resistance voltage divider sub-circuit, and the voltage regulator sub-circuit is configured to perform voltage stabilization processing on a voltage at the voltage division output terminal electrically connected to the voltage regulator sub-circuit.

In some embodiments, the voltage regulator circuit is configured with a fifth input terminal electrically connected to the first input terminal and a sixth input terminal electrically connected to the second input terminal;

the voltage regulator circuit further includes a first voltage division resistor, the at least one voltage regulator sub-circuit includes at least one second voltage division resistor, respectively, the first voltage division resistor and the at least one second voltage division resistor are sequentially connected in series between the fifth input terminal and the sixth output terminal, each the first voltage division resistor and the second voltage division resistor is configured with a first terminal and a second terminal, the first terminal of the first voltage division resistor is electrically connected to the fifth input terminal, and the second terminal of a last second voltage division resistor in the at least one second voltage division resistor is electrically connected to the sixth input terminal; and the first terminal of the second voltage division resistor is electrically connected to the voltage division output terminal corresponding to the voltage regulator sub-circuit including the second voltage division resistor.

In some embodiments, the voltage regulator sub-circuit further includes a first voltage follower sub-circuit, the first terminal of the second voltage division resistor is electrically connected to the voltage division output terminal corresponding to the voltage regulator sub-circuit including the second voltage division resistor through the first voltage follower sub-circuit; and the first voltage follower sub-circuit is configured with a seventh input terminal and a first following voltage output terminal, the seventh input terminal is electrically connected to the first terminal of the second voltage division resistor, and the first following voltage output terminal is electrically connected to the voltage division output terminal.

In some embodiments, the first voltage follower sub-circuit includes a first operational amplifier, a non-inverting input terminal of the first operational amplifier is electrically connected to the seventh input terminal of the first voltage follower sub-circuit, an inverting input terminal of the first operational amplifier is electrically connected to an output terminal of the first operational amplifier, and the output terminal of the first operational amplifier is electrically connected to the first following voltage output terminal of the first voltage follower sub-circuit including the first operational amplifier.

In some embodiments, the at least one voltage regulator sub-circuit in the voltage regulator circuit includes Q number of voltage regulator sub-circuits, the plurality of resistance voltage divider sub-circuits in the voltage divider circuit include N number of resistance voltage divider sub-circuits, a $q^{th}$ voltage regulator sub-circuit in the voltage regulator circuit is electrically connected to the voltage division output terminal corresponding to an $n^{th}$ resistance voltage divider sub-circuit in the voltage divider circuit, q is greater than or equal to 1 and less than or equal to Q, n is greater than or equal to 2 and less than or equal to N, and q and n are all integers;

each of the plurality of resistance voltage divider sub-circuits includes a third voltage division resistor;

the first voltage division resistor and the second voltage division resistors in the voltage regulator circuit, and the third voltage division resistors in the voltage divider circuit satisfy:

$$\frac{\sum_{i=q}^{Q} R\_i}{\sum_{i=1}^{Q} R\_i + R\_0} = \frac{\sum_{j=n}^{N} r\_j}{\sum_{j=1}^{N} r\_j}, \text{ and}$$

$$\sum_{i=q}^{Q} R\_i < \sum_{j=n}^{N} r\_j,$$

wherein R_i indicates a resistance value of the second voltage division resistor in an $i^{th}$ voltage regulator sub-circuit in the voltage regulator circuit, R_0 indicates a resistance value of the first voltage division resistor in the voltage regulator circuit, r_j indicates a resistance value of the third voltage division resistor in the voltage division circuit, and i and j are all positive integers.

In some embodiments, the first voltage division resistor is a variable resistor.

In some embodiments, the sampling circuit further includes a plurality of second voltage follower sub-circuits, wherein each of the plurality of second voltage follower sub-circuits is between one of the plurality of voltage division output terminals and the switch sub-circuit corresponding to the voltage division output terminal, and the second voltage follower sub-circuit is configured with an eighth input terminal electrically connected to the voltage division output terminal and a second following voltage output terminal electrically connected to the switch sub-circuit.

In some embodiments, the second voltage follower sub-circuit includes a second operational amplifier, a non-inverting input terminal of the second operational amplifier is electrically connected to the eighth input terminal of the second voltage follower sub-circuit, an inverting input terminal of the second operational amplifier is electrically connected to an output terminal of the second operational amplifier, and the output terminal of the second operational amplifier is electrically connected to the second following voltage output terminal of the second voltage follower sub-circuit including the second operational amplifier.

In some embodiments, each of the plurality of resistance voltage divider sub-circuits includes a third voltage division resistor; and the third voltage division resistor in at least one of the plurality of resistance voltage divider sub-circuits in the voltage divider circuit is a variable resistor.

In some embodiments, the third voltage division resistor in the first resistance voltage divider sub-circuit is a variable resistor; and/or the third voltage division resistor in the last resistance voltage divider sub-circuit is a variable resistor.

In some embodiments, the sampling circuit further includes a control circuit, wherein the control circuit is connected to the plurality of switch sub-circuits;

the control sub-circuit is configured to control the plurality of switch sub-circuits to be sequentially turned on according to a preset sequence, and at most one switch sub-circuit in the plurality of switch sub-circuits is turned on at any moment; and the preset sequence includes an ascending order of positions of the resistance voltage divider sub-circuits corresponding to the switch sub-circuits, in the voltage divider circuit, or a descending order of the positions of the resistance voltage divider sub-circuits corresponding to the switch sub-circuits, in the voltage divider circuit.

In some embodiments, the comparator circuit is specifically configured to output a first result when determining by comparison that a voltage at the third input terminal is equal to a voltage at the fourth input terminal, and to output a second result when determining by comparison that the voltage at the third input terminal is not equal to the voltage at the fourth input terminal; and one of the first result and the second result is a high level signal, and the other of the first result and the second result is a low level signal.

In a second aspect, an embodiment of the present disclosure further provides an optical detection system, including a light sensing circuit and the sampling circuit as provided in the first aspect, wherein an output terminal of the light sensing circuit is electrically connected to the sampling voltage input terminal, and the light sensing circuit is configured to sense light and generate a corresponding sampling voltage according to intensity of the light.

In a third aspect, an embodiment of the present disclosure further provides a display apparatus, including the light detection system as provided in the second aspect above.

In a fourth aspect, an embodiment of the present disclosure further provides a sampling method based on the sampling circuit provided in the first aspect, and the sampling method includes:

performing resistance voltage division processing by the plurality of resistance voltage divider sub-circuits in the voltage divider circuit according to the voltages at the first input terminal and the second input terminal, and writing divided voltages to the plurality of voltage division output terminals, respectively;

sequentially turning on the plurality of switch sub-circuits in the switch circuit according to a preset sequence, so as to sequentially write the divided voltages at the plurality of voltage division output terminals to the third input terminal; and comparing the voltages at the third input terminal and the fourth input terminal through the comparator circuit, and providing comparison results to the sampling output terminal;

wherein the preset sequence includes an ascending order of positions of the resistance voltage divider sub-circuits corresponding to the switch sub-circuits, in the voltage divider circuit, or a descending order of the positions of the resistance voltage divider sub-circuits corresponding to the switch sub-circuits, in the voltage divider circuit.

DETAIL DESCRIPTION OF EMBODIMENTS

In order to enable one of ordinary skill in the art to better understand the technical solutions of the present disclosure, a sampling circuit, an optical detection system, a display apparatus and a sampling method provided by the present disclosure are described in detail below with reference to the accompanying drawings.

In the related art, a sampling circuit, which is configured with an analog signal input terminal, a control signal input terminal, and an analog signal output terminal, generally includes an analog switch, a holding capacitor and a non-inverting circuit with a unity gain of 1. A sampling operation is switched between a sampling state and a holding state. In the sampling state, the switch is turned on, and a level change of the analog input signal is tracked as quickly as possible until an arrival of the hold signal. In the holding state, the switch is turned off, the tracking process is stopped, and an instantaneous value of the input signal before the turning off of the switch is held. However, the sampling circuit involved in the related art has a complex circuit structure, an unstable sampling process and low sampling accuracy.

Figure 1:
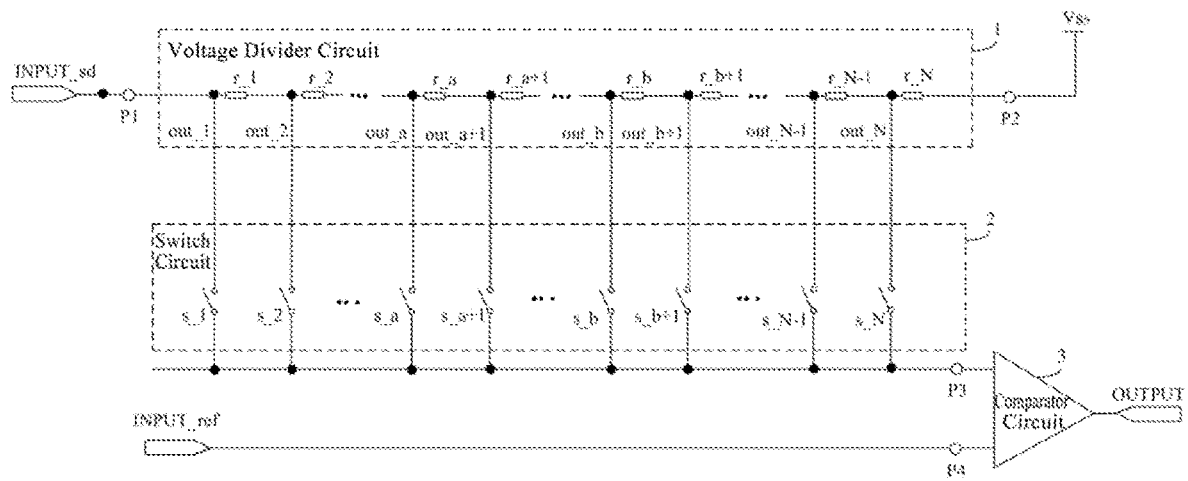
FIG. 1 is a schematic diagram illustrating a circuit structure of a sampling circuit provided in an embodiment of the present disclosure.

In order to solve technical problems in the related art, an embodiment of the present disclosure provides a new sampling circuit. FIG. 1 is a schematic diagram illustrating a circuit structure of a sampling circuit provided in an embodiment of the present disclosure. As shown in FIG. 1, the sampling circuit is configured with a sampling voltage input terminal INPUT_sd, a reference voltage input terminal INPUT_ref, and a sampling output terminal OUTPUT. The sampling circuit includes a voltage divider circuit 1, a switch circuit 2 and a comparator circuit 3. The voltage divider circuit 1 includes a first input terminal P1, a second input terminal P2, and a plurality of voltage division output terminals out_1 to out_N, the second input terminal P2 is electrically connected to a first power supply terminal, and the comparator circuit 3 includes a third input terminal P3 and a fourth input terminal P4.

The voltage divider circuit 1 includes a plurality of resistance voltage divider sub-circuits sequentially connected in series between the first input terminal P1 and the second input terminal P2 and in a one-to-one correspondence with the voltage division output terminals out_1 to out_N. In an embodiment of the present disclosure, the plurality of resistance voltage divider sub-circuits are sequentially arranged in series, and FIG. 1 illustrates a case where the resistance voltage divider sub-circuits are sequentially arranged from left to right, where the resistance voltage divider sub-circuit located at the leftmost side is a first resistance voltage divider sub-circuit, and the circuit voltage divider sub-circuit located at the rightmost side is a last resistance voltage divider sub-circuit. Each of the resistance voltage divider sub-circuits has a first terminal and a second terminal, the first terminal of the first resistance voltage divider sub-circuit is electrically connected to the first input terminal P1, the first terminal of the voltage divider sub-circuit other than the first resistance voltage divider sub-circuit is electrically connected to the second terminal of a previous resistance voltage divider sub-circuit, and the second terminal of the last resistance voltage divider sub-circuit is electrically connected to the second input terminal P2. The first terminal of the resistance voltage divider sub-circuit is electrically connected to a corresponding voltage division output terminal, and the resistance voltage divider sub-circuits are configured to perform resistance voltage division processing according to voltages at the first input terminal P1 and the second input terminal P2, and write a corresponding divided voltage to the corresponding voltage division output terminals out_1 to out_N.

The switch circuit 2 includes a plurality of switch sub-circuits s_1 to s_N in a one-to-one correspondence with the voltage division output terminals out_1 to out_N. The voltage division output terminals out_1 to out_N are electrically connected to the third input terminal P3 through the corresponding switch sub-circuits s_1 to s_N. The switch sub-circuits s_1 to s_N are configured to control connection/break between the corresponding voltage division output terminals out_1 to out_N and the third input terminal P3.

The comparator circuit 3 is electrically connected to the sampling output terminal OUTPUT, and is configured to compare voltages at the third input terminal P3 and the fourth input terminal P4, and provide a comparison result to the sampling output terminal OUTPUT.

One of the first input terminal P1 and the fourth input terminal P4 is electrically connected to the sampling voltage input terminal INPUT_sd, and the other of the first input terminal P1 and the fourth input terminal P4 is electrically connected to the reference voltage input terminal INPUT_ref.

The sampling voltage input terminal INPUT_sd is connected to an external light sensing circuit, and is used for transmitting a sampling voltage Vsd generated by the light sensing circuit to the sampling circuit for being sampled by the sampling circuit. The reference voltage input terminal INPUT_ref is connected to an external reference voltage (Vref) supplying module, and is used for transmitting a reference voltage generated by the reference voltage supplying module to the sampling circuit. The first power supply terminal is used to supply an operating voltage Vss. Vref and Vss may be designed and adjusted in advance according to practical requirements.

The following describes a sampling process of the sampling circuit provided in an embodiment of the present disclosure in detail with reference to specific examples.

Referring to FIG. 1, as an example, the first input terminal P1 is electrically connected to the sampling voltage input terminal INPUT_sd, and the fourth input terminal P4 is connected to the reference voltage input terminal INPUT_ref. That is, the sampling voltage Vsd is written to the first input terminal P1 of the voltage divider circuit 1, and the reference voltage Vref is written to the fourth input terminal P4 of the comparator circuit 3. In this case, the voltage divider circuit 1 may divide the sampling voltage Vsd.

The voltage divider circuit 1 includes N number of resistance voltage divider sub-circuits, wherein N is a positive integer greater than 2. The resistance voltage divider sub-circuit includes at least one third voltage division resistor. In some embodiments, the N number of resistance voltage divider sub-circuits include N number of third voltage division resistors r_1 to r_N. A resistance value of the third voltage division resistor in the $j^{th}$ resistance voltage divider sub-circuit is r_j, where 1≤j≤N, and j is an integer.

In some embodiments, the resistance values of the third voltage division resistors r_1 to r_N in the resistance voltage divider sub-circuits may be the same or different. In practical applications, the resistance values of the third voltage division resistors r_1 to r_N in the resistance voltage divider sub-circuits may be designed according to practical requirements.

In the voltage divider circuit 1, according to the principle of resistance voltage division, the divided voltage V_j output from the voltage division output terminal out_j corresponding to the $j^{th}$ resistance voltage divider sub-circuit is:

$$V\_j = \frac{\sum_{i=j}^{N} r\_i}{\sum_{i=1}^{N} r\_i} * (Vsd - Vss) + Vss.$$

Generally, a value of the operating voltage Vss is approximately equal to 0, and the divided voltage V_j is approximately equal to:

$$\frac{\sum_{i=j}^{N} r\_i}{\sum_{i=1}^{N} r\_i} * Vsd.$$

Further, where the third voltage division resistors r_1 to r_N in the resistance voltage divider sub-circuits have a same resistance value, the divided voltage V_j is approximately equal to:

$$\frac{N-j+1}{N} * Vsd.$$

In this case, $$Vsd = \frac{N}{N-j+1} * V\_j.$$

The switch sub-circuits s_1 to s_N in the switch circuit 2 are controlled to be sequentially turned on according to a preset sequence, so that the divided voltages at the corresponding voltage division output terminals out_1 to out_N are sequentially written to the third input terminal P3. The preset sequence includes an ascending order of positions of the resistance voltage divider sub-circuits corresponding to the switch sub-circuits s_1 to s_N in the voltage divider circuit 1, or a descending order of the positions of the resistance voltage divider sub-circuits corresponding to the switch sub-circuits s_1 to s_N in the voltage divider circuit 1.

Figure 2:
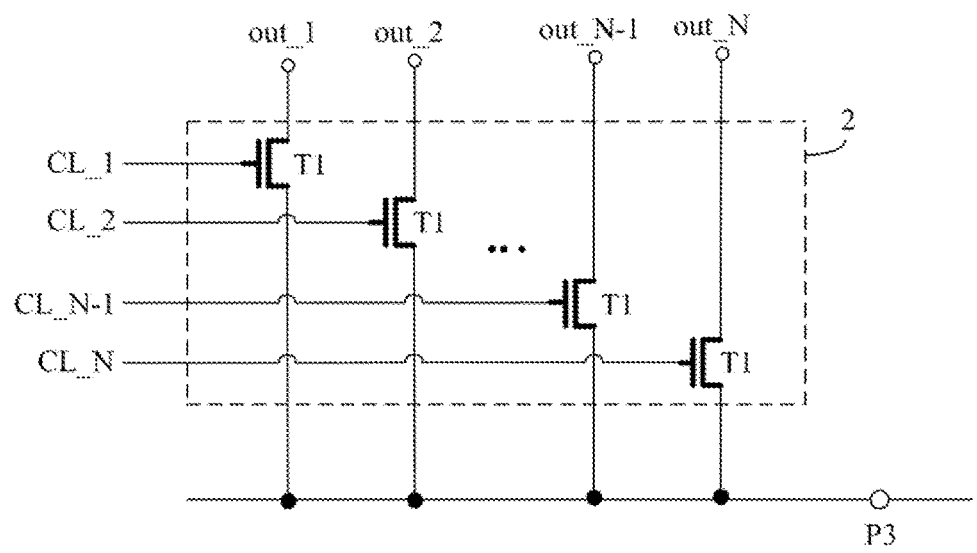
FIG. 2 is a schematic diagram illustrating a circuit structure of a switch circuit in an embodiment of the disclosure.

FIG. 2 is a schematic diagram illustrating a circuit structure of the switch circuit 2 in an embodiment of the disclosure. As shown in FIG. 2, the switch sub-circuits s_1 to s_N each include a switch transistor T1, a first terminal of the switch transistor T1 is electrically connected to a corresponding one of the voltage division output terminals out_1 to out_N, a second terminal of the switch transistor T1 is electrically connected to the third input terminal P3 of the comparator circuit 3, and a control electrode of the switch transistor is connected to a corresponding one of control signal lines CL_1 to CL_N. In the following description, an example in which the switching transistor is an N-type transistor is described.

Figure 3:
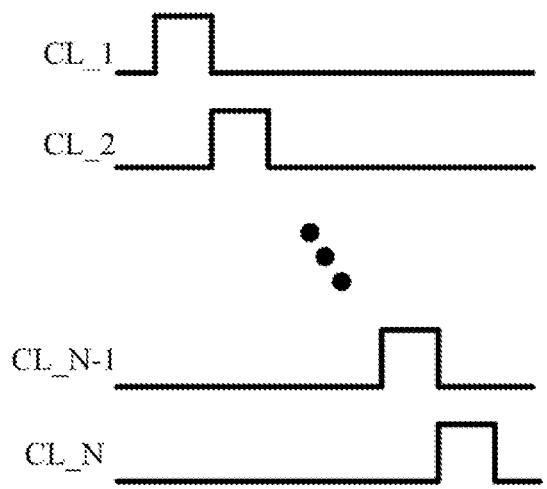
FIG. 3 is a timing diagram illustrating an operation of a switch circuit in an embodiment of the present disclosure.

FIG. 3 is a timing diagram illustrating an operation of the switch circuit 2 in an embodiment of the present disclosure. As shown in FIG. 3, the preset sequence is the ascending order of the positions of the resistance voltage divider sub-circuits corresponding to the switch sub-circuits s_1 to s_N in the voltage divider circuit 1. A first control signal line CL_1, a second control signal line CL_2, a third control signal line CL_3, . . . , and an $N^{th}$ control signal line CL_N sequentially output a high level signal. The switch sub-circuit s_1, the switch sub-circuit s_2, the switch sub-circuit s_3, . . . , and the switch sub-circuit s_N are sequentially turned on. The voltage division output terminal out_1, the voltage division output terminal out_2, the voltage division output terminal out_3 . . . , and the voltage division output terminal out_N sequentially write corresponding divided voltages to the third input terminal P3 of the comparator circuit 3. The comparator circuit 3 compares N number of different divided voltages written to the third input terminal P3, respectively, with the reference voltage Vref written to the fourth input terminal P4, and outputs N number of comparison results, which may represent a voltage magnitude of the sampling voltage Vsd. Then, the sampling of the reference voltage is completed.

Figure 4:
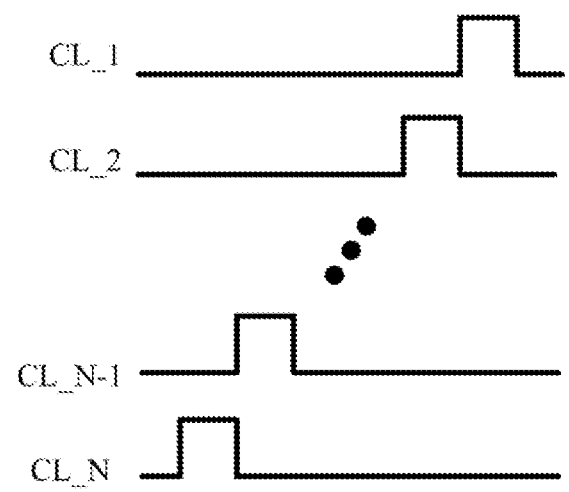
FIG. 4 is a timing diagram illustrating another operation of a switch circuit in an embodiment of the disclosure.

FIG. 4 is a timing diagram illustrating another operation of the switch circuit 2 in an embodiment of the present disclosure. As shown in FIG. 4, the preset sequence is the descending order of the positions of the resistance voltage divider sub-circuits corresponding to the switch sub-circuits s_1 to s_N in the voltage divider circuit 1. The $N^{th}$ control signal line CL_N, the (N−1)th control signal line CL_N−1, the (N−2)$^{th}$ control signal line CL_N−2, . . . , and the first control signal line CL_1 sequentially output a high level signal. The switch sub-circuit s_N, the switch sub-circuit s_N−1, the switch sub-circuit s_N−2 . . . , and the switch sub-circuit s_1 are sequentially turned on. The voltage division output terminal out_N, the voltage division output terminal out_N−1, the voltage division output terminal out_N−2 . . . , and the voltage division output terminal out_1 sequentially write corresponding divided voltages to the third input terminal P3 of the comparator circuit 3. The comparator circuit 3 compares N number of different divided voltages written to the third input terminal P3, respectively, with the reference voltage Vref written to the fourth input terminal P4, and outputs N number of comparison results, which may represent the voltage magnitude of the sampling voltage Vsd. Then, the sampling of the reference voltage is completed.

In some embodiments, the comparator circuit 3 is specifically configured to output a first result when determining by comparison that a voltage at the third input terminal P3 is equal to a voltage at the fourth input terminal P4, and to output a second result when determining by comparison that the voltage at the third input terminal P3 is not equal to the voltage at the fourth input terminal P4. One of the first result and the second result is a high level signal (indicated by "1"), and the other of the first result and the second result is a low level signal (indicated by "0"). That is, when the sampling circuit completes a whole sampling process, the comparator circuit 3 outputs N number of 1-bit comparison results, that is, the sampling output terminal OUTPUT outputs a sampling result of N bits. Based on the above, it can be seen that the sampling circuit provided in the embodiment of the present disclosure can not only complete sampling of the sampling voltage, but also complete analog-to-digital conversion processing of the sampling voltage, so as to facilitate subsequent further processing.

As a specific example, the first result is a high level signal "1", the second result is a low level signal "0", N has a value of $2^4=16$, the operating voltage Vss=0V, the reference voltage Vref=1V, the resistance values of the third voltage division resistors r_1 to r_N in the voltage divider sub-circuits in the voltage divider circuit 1 are all equal to each other, and the preset sequence is the ascending order of the positions of the resistance voltage divider sub-circuits corresponding to the switch sub-circuits s_1 to s_N in the voltage divider circuit 1. If the 16-bit signal output by the sampling output terminal OUTPUT is "0000001000000000", that is, the seventh bit is "1", and the other bits are all "0", it may be inferred that the divided voltage V_7 output by the voltage division output terminal out_j corresponding to the seventh switch sub-circuits s_1 to s_7 in the voltage divider circuit 1 is equal to the reference voltage Vref, that is, V_7=1V. Further, since $$Vsd = \frac{N}{N-j+1} * V\_j,$$

where N=16, j=7, and V_7=1V, the sampling voltage Vsd=1.6V may be calculated.

As another specific example, the first result is a high level signal "1", the second result is a low level signal "0", N has a value of $2^4=16$, the operating voltage Vss=0V, the reference voltage Vref=1V, the resistance values of the third voltage division resistors r_1 to r_N in the voltage divider sub-circuits in the voltage divider circuit 1 are all equal to each other, and the preset sequence is the descending order of the positions of the resistance voltage divider sub-circuits corresponding to the switch sub-circuits s_1 to s_N in the voltage divider circuit 1. If the 16-bit signal output by the sampling output terminal OUTPUT is "0000001000000000", that is, the seventh bit is "1", and the other bits are all "0", it may be inferred that the divided voltage V_10 output by the voltage division output terminal out_j corresponding to the tenth switch sub-circuit s_10 in the voltage divider circuit 1 is equal to the reference voltage Vref, that is, V_10=1V. Further, since $$Vsd = \frac{N}{N-j+1} * V\_j,$$

where N=16, j=10, and V_10=1V, the sampling voltage Vsd≈2.3V may be calculated.

Figure 5:
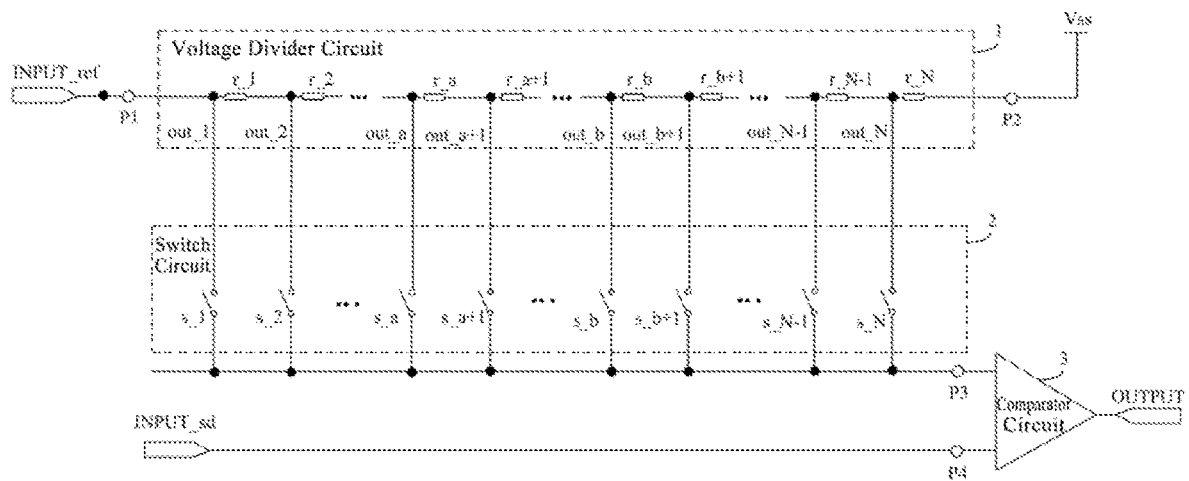
FIG. 5 is a schematic diagram illustrating a circuit structure of another sampling circuit provided in an embodiment of the present disclosure.

FIG. 5 is a schematic diagram illustrating a circuit structure of another sampling circuit provided in an embodiment of the present disclosure. As shown in FIG. 5, different from the embodiment shown in FIG. 1, the first input terminal P1 in the embodiment shown in FIG. 5 is electrically connected to the reference voltage input terminal INPUT_ref, and the fourth input terminal P4 is electrically connected to the sampling voltage input terminal INPUT_sd. That is, the reference voltage Vref is written to the first input terminal P1 of the voltage divider circuit 1, and the sampling voltage Vsd is written to the fourth input terminal P4 of the comparator circuit 3. In this case, the voltage divider circuit 1 may divide the reference voltage Vref.

The voltage divider circuit 1 includes N number of resistance voltage divider sub-circuits, wherein N is a positive integer greater than 2. The resistance voltage divider sub-circuit includes at least one third voltage division resistor. In some embodiments, the N number of resistance voltage divider sub-circuits include N number of third voltage division resistors r_1 to r_N. The resistance value of the third voltage division resistor in the $j^{th}$ resistance voltage divider sub-circuit is r_j, where 1≤j≤N, and j is an integer.

In some embodiments, the resistance values of the third voltage division resistors r_1 to r_N in the resistance voltage divider sub-circuits may be the same or different. In practical applications, the resistance values of the third voltage division resistors r_1 to r_N in the resistance voltage divider sub-circuits may be designed according to practical requirements.

In the voltage divider circuit 1, according to the principle of resistance voltage division, the divided voltage V_j output from the voltage division output terminal out_j corresponding to the $j^{th}$ resistance voltage divider sub-circuit is:

$$V\_j = \frac{\sum_{i=j}^{N} r\_i}{\sum_{i=1}^{N} r\_i} * (Vref - Vss) + Vss.$$

Generally, a value of the operating voltage Vss is approximately equal to 0, and the divided voltage V_j is approximately equal to:

$$\frac{\sum_{i=j}^{N} r\_i}{\sum_{i=1}^{N} r\_i} * Vref.$$

Further, when the third voltage division resistors r_1 to r_N in the resistance voltage divider sub-circuits have a same resistance value, the divided voltage V_j is approximately equal to:

$$\frac{N-j+1}{N} * Vref.$$

The switch sub-circuits s_1 to s_N in the switch circuit 2 are controlled to be sequentially turned on according to a preset sequence, so that the divided voltages at the corresponding voltage division output terminals out_1 to out_N are sequentially written to the third input terminal P3. The preset sequence includes an ascending order of positions of the resistance voltage divider sub-circuits corresponding to the switch sub-circuits s_1 to s_N in the voltage divider circuit 1, or a descending order of the positions of the resistance voltage divider sub-circuits corresponding to the switch sub-circuits s_1 to s_N in the voltage divider circuit 1.

Where the preset sequence is the ascending order of the positions of the resistance voltage divider sub-circuits corresponding to the switch sub-circuits s_1 to s_N in the voltage divider circuit 1, the switch sub-circuit s_1, the switch sub-circuit s_2, the switch sub-circuit s_3, . . . , and the switch sub-circuit s_N are sequentially turned on. The voltage division output terminal out_1, the voltage division output terminal out_2, the voltage division output terminal out_3 . . . , and the voltage division output terminal out_N sequentially write corresponding divided voltages to the third input terminal P3 of the comparator circuit 3. The comparator circuit 3 compares N number of different divided voltages written to the third input terminal P3, respectively, with the sampling voltage Vsd written to the fourth input terminal P4, and outputs N number of comparison results, which may represent a voltage magnitude of the sampling voltage Vsd. Then, the sampling of the reference voltage is completed.

Where the preset sequence is the descending order of the positions of the resistance voltage divider sub-circuits corresponding to the switch sub-circuits s_1 to s_N in the voltage divider circuit 1, the switch sub-circuit s_N, the switch sub-circuit s_N−1, the switch sub-circuit s_N−2 . . . , and the switch sub-circuit s_1 are sequentially turned on. The voltage division output terminal out_N, the voltage division output terminal out_N−1, the voltage division output terminal out_N−2 . . . , and the voltage division output terminal out_1 sequentially write corresponding divided voltages to the third input terminal P3 of the comparator circuit 3. The comparator circuit 3 compares N number of different divided voltages written to the third input terminal P3, respectively, with a sampling voltage Vsd written to a fourth input terminal P4, and outputs N number of comparison results, which may represent the voltage magnitude of the sampling voltage Vsd. Then, the sampling of the reference voltage is completed.

In some embodiments, the comparator circuit 3 is specifically configured to output a first result when determining by comparison that the voltage at the third input terminal P3 is equal to the voltage at the fourth input terminal P4, and to output a second result when determining by comparison that the voltage at the third input terminal P3 is not equal to the voltage at the fourth input terminal P4. One of the first result and the second result is a high level signal (indicated by "1"), and the other of the first result and the second result is a low level signal (indicated by "0"). That is, when the sampling circuit completes a whole sampling process, the comparator circuit 3 outputs N number of 1-bit comparison results, that is, the sampling output terminal OUTPUT outputs a sampling result of N bits. Based on the above, it can be seen that the sampling circuit provided in the embodiment of the present disclosure can not only complete sampling of the sampling voltage, but also complete analog-to-digital conversion processing of the sampling voltage, so as to facilitate subsequent further processing.

As a specific example, the first result is a high level signal "1", the second result is a low level signal "0", N has a value of $2^4$+=16, the operating voltage Vss=0V, the reference voltage Vref=1V, the resistance values of the third voltage division resistors r_1 to r_N in the voltage divider sub-circuits in the voltage divider circuit 1 are all equal, and the preset sequence is the ascending order of the positions of the resistance voltage divider sub-circuits corresponding to the switch sub-circuits s_1 to s_N in the voltage divider circuit 1. If the 16-bit signal output by the sampling output terminal OUTPUT is "0000001000000000", that is, the seventh bit is "1", and the other bits are all "0", it may be inferred that the divided voltage V_7 output by the voltage division output terminal out_j corresponding to the seventh switch sub-circuit s_7 in the voltage divider circuit 1 is equal to the sampling voltage Vsd, that is, V_7=Vsd. Further, since $$V\_j = \frac{N-j+1}{N} * Vref,$$

where N=16, j=7, and Vref=1V, V_7=0.625V may be calculated, i.e., the sampling voltage Vsd=0.625V.

As another specific example, the first result is a high level signal "1", the second result is a low level signal "0", N has a value of $2^4$+=16, the operating voltage Vss=0V, the reference voltage Vref=1V, the resistance values of the third voltage division resistors r_1 to r_N in the voltage divider sub-circuits in the voltage divider circuit 1 are all equal, and the preset sequence is the descending order of the positions of the resistance voltage divider sub-circuits corresponding to the switch sub-circuits s_1 to s_N in the voltage divider circuit 1. If the 16-bit signal output by the sampling output terminal OUTPUT is "0000001000000000", that is, the seventh bit is "1", and the other bits are all "0", it may be inferred that the divided voltage V_10 output by the voltage division output terminal out_j corresponding to the tenth switch sub-circuit s_10 in the voltage divider circuit 1 is equal to the sampling voltage Vref, that is, V_10=Vsd. Further, since $$V\_j = \frac{N-j+1}{N} * Vref,$$

where N=16, j=10 and Vref=1V, V_7=0.4375V may be calculated, i.e., the sampling voltage Vsd=0.4375V.

In some embodiments, the third voltage division resistor in each of at least one resistance voltage divider sub-circuit in the voltage divider circuit 1 is a variable resistor (e.g., a slide rheostat or a digital rheostat). In this case, a voltage division ratio of a voltage division resistor string formed by the third voltage division resistors is adjustable to adapt to more application scenarios.

In some embodiments, the third voltage division resistor r_1 in the first resistance voltage divider sub-circuit is a variable resistor; and/or the third voltage division resistor r_N in the last resistance voltage divider sub-circuit is a variable resistor.

The sampling circuit provided in the embodiments of the disclosure has the advantages of a simple structure, a stable sampling process and high sampling accuracy.

Figure 6:
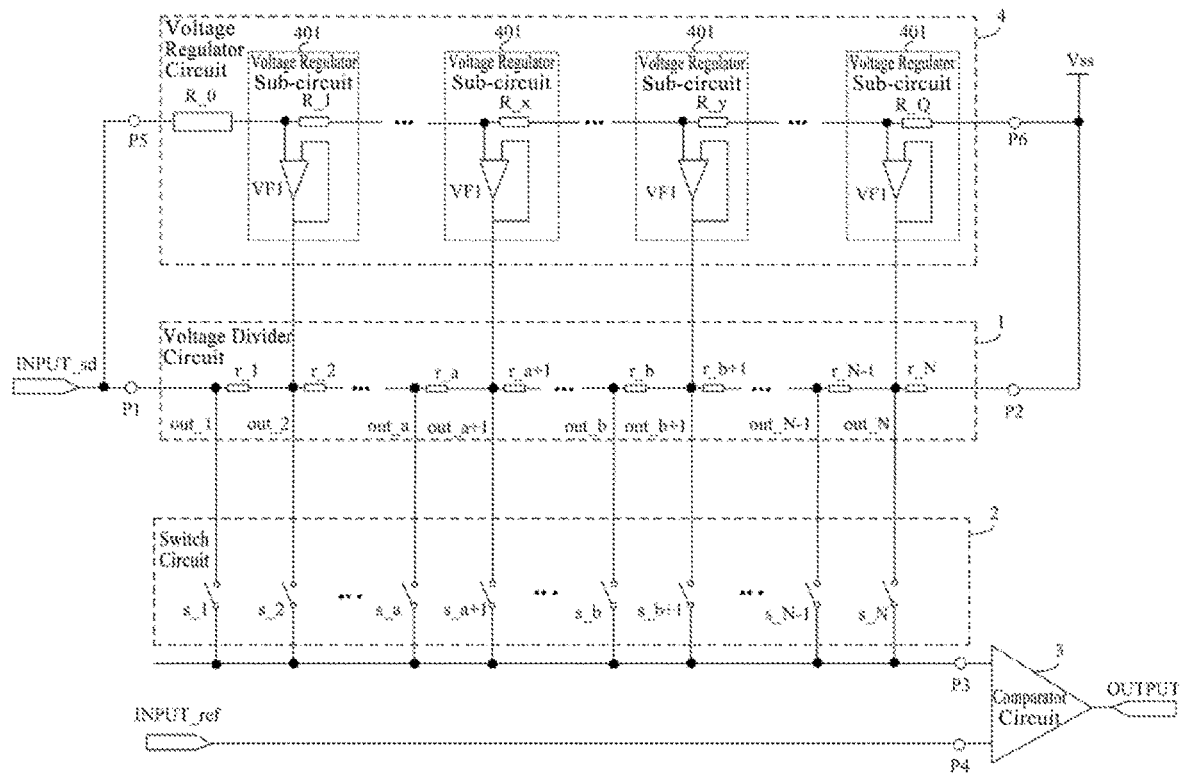
FIG. 6 is a schematic diagram illustrating a circuit structure of another sampling circuit provided in an embodiment of the present disclosure.

FIG. 6 is a schematic diagram illustrating a circuit structure of another sampling circuit provided in an embodiment of the present disclosure. As shown in FIG. 6, different from the previous embodiments, the sampling circuit provided in this embodiment of the present disclosure includes not only the voltage divider circuit 1, the switch circuit 2, and the comparator circuit 3, but also a voltage regulator circuit 4. The voltage regulator circuit 4 includes at least one voltage regulator sub-circuit 401.

The voltage regulator sub-circuit 401 is electrically connected to any one of the voltage division output terminals out_2 to out_N except the voltage division output terminal out_1 corresponding to the first resistance voltage divider sub-circuit, and the voltage regulator sub-circuit 401 is configured to perform voltage stabilization processing on the voltage at the voltage division output terminal electrically connected to the voltage regulator sub-circuit 401.

In an embodiment of the present disclosure, the voltage stabilization processing may be performed at a part of the voltage division output terminals out_2 to out_N in the voltage divider circuit 1 according to practical requirements, so as to avoid a problem that the voltages at the part of the voltage division output terminals out_2 to out_N are not stable due to unstable currents in the voltage divider circuit 1, wherein the unstable currents are caused by drift of resistance values of the part of the third voltage division resistors r_1 to r_N in the sampling process.

In practical applications, the voltage regulator circuit 4 may be configured to perform voltage stabilization control on some key nodes in the voltage divider circuit 1 (which are pre-selected according to practical requirements, the voltage division output terminal out_1 corresponding to the first resistance voltage divider sub-circuit is directly connected to the first input terminal P1, and the voltage of the voltage division output terminal out_1 corresponding to the first resistance voltage divider sub-circuit does not need to be regulated).

In some embodiments, the voltage regulator circuit 401 is configured with a fifth input terminal P5 and a sixth input terminal P6, the fifth input terminal P5 is electrically connected to the first input terminal P1, and the sixth input terminal P6 is electrically connected to the second input terminal P2. The voltage regulator circuit 4 further includes a first voltage division resistor R_0, the voltage regulator sub-circuit 401 includes a second voltage division resistors R_1 to R_Q, and the first voltage division resistor R_0 and all the second voltage division resistors R_1 to R_Q are sequentially connected in series between the fifth input terminal P5 and the sixth output terminal. In an embodiment of the present disclosure, the first voltage division resistor R_0 and the plurality of second voltage division resistors R_1 to R_Q are sequentially arranged in series, and FIG. 6 illustrates an example in which the first voltage division resistor R_0 and the plurality of second voltage division resistors R_1 to R_Q are sequentially arranged from left to right, where the second voltage division resistor R_1 connected to the first voltage division resistor is a first second voltage division resistor, and the second voltage division resistor R_Q located at the rightmost side is a last second voltage division resistor. The first voltage division resistor R_0 and each of the second voltage divider circuits R_1 to R_Q each have a first terminal and a second terminal. The first terminal of the first voltage division resistor R_0 is electrically connected to the fifth input terminal P5, the first terminal of the first second voltage division resistor R_1 is electrically connected to the second terminal of the first voltage division resistor R_0, a first terminal of any other second voltage division resistor except the first second voltage division resistor R_1 is electrically connected to a second terminal of a previous second voltage division resistor, and the second terminal of the last second voltage division resistor R_Q is electrically connected to the sixth input terminal P6. The first terminals of the second voltage division resistors R_1 to R_Q are electrically connected to voltage division output terminals out_2 to out_N corresponding to the voltage regulator sub-circuits 401 including the second voltage division resistors R_1 to R_Q, respectively.

In some embodiments, Q number of the voltage regulator sub-circuits 401 are provided in the voltage regulator circuit 4, N number of the resistance voltage divider sub-circuits are provided in the voltage divider circuit 1, and a $q^{th}$ voltage regulator sub-circuit 401 in the voltage regulator circuit 4 is electrically connected to a voltage division output terminal out_N corresponding to an $n^{th}$ resistance voltage divider sub-circuit in the voltage divider circuit 1, where $1 \leq q \leq Q$, $2 \leq n \leq N$, and both q and n are integers.

The first voltage division resistor R_0 and the second voltage division resistors R_1 to R_Q in the voltage regulator circuit 4, and the third voltage division resistors r_1 to r_N in the voltage divider circuit 1 satisfy:

$$\frac{\sum_{i=q}^{Q} R\_i}{\sum_{i=1}^{Q} R\_i + R\_0} = \frac{\sum_{j=n}^{N} r\_j}{\sum_{j=1}^{N} r\_j}, \text{ and}$$

$$\sum_{i=q}^{Q} R\_i < \sum_{j=n}^{N} r\_j,$$

wherein R_i indicates the resistance value of the second voltage division resistor R_i in the $i^{th}$ voltage regulator sub-circuit 401 in the voltage regulator circuit 4, R_0 indicates the resistance value of the first voltage division resistor in the voltage regulator circuit 4, and r_j indicates the resistance value of the third voltage division resistor in the voltage divider circuit 1, where both i and j are positive integers.

Taking the case where the voltage division output terminal out_n corresponding to the $n^{th}$ resistance voltage divider sub-circuit in the voltage regulator circuit 4 is electrically connected to the $q^{th}$ voltage regulator sub-circuit 401 in the voltage regulator circuit 1 as an example, the resistor string formed by the third voltage division resistor r_n to the third voltage division resistor r_N is connected in parallel with the resistor string formed by the second voltage division resistor R_q to the second voltage division resistor R_Q. Since $$\sum_{i=q}^{Q} R\_i < \sum_{j=n}^{N} r\_j,$$

the divided voltage of the voltage division output terminal out_n corresponding to the $n^{th}$ resistance voltage divider sub-circuit is mainly determined by the second voltage division resistor R_q to the second voltage division resistor R_Q (it may be considered that the resistor string formed by the third voltage division resistor r_n to the third voltage division resistor r_N is connected in parallel as a load to the voltage division resistor string formed by the first voltage division resistor R_0 and the second voltage division resistors). Therefore, even when resistance values of some of the third voltage division resistors in the voltage divider circuit 1 have drifted, the $q^{th}$ voltage regulator sub-circuit 401 still outputs a corresponding divided voltage to the voltage division output terminal out_n corresponding to the $n^{th}$ resistance voltage divider sub-circuit, to maintain the stability of the divided voltage at the voltage division output terminal out_n corresponding to the $n^{th}$ resistance voltage divider sub-circuit.

With continued reference to FIG. 6, in some embodiments, the voltage regulator sub-circuit 401 further includes a first voltage follower sub-circuit VF1. The first terminals of the second voltage division resistors R_1 to R_Q are electrically connected to voltage division output terminals corresponding to the voltage regulator sub-circuits 401 including the second voltage division resistors R_1 to R_Q, respectively, through the first voltage follower sub-circuits VF1. The first voltage follower sub-circuits VF1 are configured with seventh input terminals electrically connected to the first terminals of the second voltage division resistors R_1 to R_Q, respectively, and first following voltage output terminals electrically connected to the corresponding voltage division output terminals, respectively.

In the embodiments of the present disclosure, by providing the first voltage follower sub-circuit VF1 in the voltage regulator sub-circuit 401, a high input impedance of the first voltage follower sub-circuit VF1 prevents the voltage regulator circuit 4 from being affected by the voltage divider circuit 1, and a low output impedance of the first voltage follower sub-circuit VF1 enhances the capability for driving the voltage isolation element, so that the first voltage follower sub-circuit VF1 can function as a buffer between the voltage regulator circuit 4 and the voltage divider circuit 1.

In some embodiments, the first voltage follower sub-circuit VF1 includes a first operational amplifier. The non-inverting input terminal of the first operational amplifier is electrically connected to the seventh input terminal of the first voltage follower sub-circuit VF1 including the first operational amplifier, the inverting input terminal of the first operational amplifier is electrically connected to the output terminal of the first operational amplifier, and the output terminal of the first operational amplifier is electrically connected to the first following voltage output terminal of the first voltage follower sub-circuit VF1 including the first operational amplifier.

It should be noted that the first voltage follower sub-circuit VF1 in the embodiment of the present disclosure may alternatively adopt other circuit structures with voltage follower functions, which will not be illustrated herein.

In some embodiments, the first voltage division resistor R_0 is a variable resistor, so that the voltage division ratio of the voltage division resistor string formed by the first voltage division resistor R_0 and the second voltage division resistors R_1 to R_Q is adjustable to adapt to more application scenarios.

Figure 7:
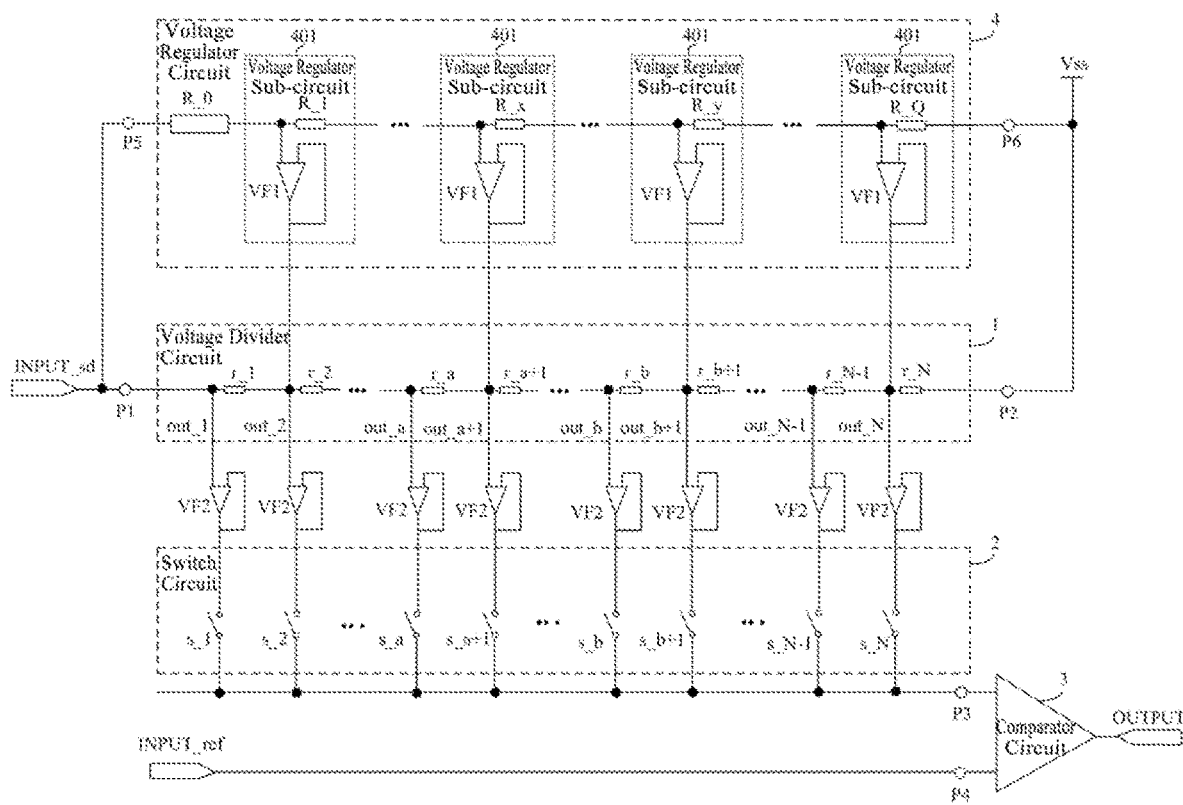
FIG. 7 is a schematic diagram illustrating a circuit structure of another sampling circuit provided in an embodiment of the disclosure.

FIG. 7 is a schematic diagram illustrating a circuit structure of another sampling circuit provided in an embodiment of the present disclosure. As shown in FIG. 7, different from the previous embodiments, in this embodiment of the present disclosure, second voltage follower sub-circuits VF2 are disposed between the voltage division output terminals out_1 to out_N and the corresponding switch sub-circuits s_1 to s_N, respectively. The second voltage follower sub-circuit VF2 is configured with an eighth input terminal and a second following voltage output terminal. The eighth input terminals are electrically connected to the corresponding voltage division output terminals out_1 to out_N, respectively, and the second following voltage output terminals are electrically connected to the corresponding switch sub-circuits s_1 to s_N, respectively.

In an embodiment of the present disclosure, the second voltage follower sub-circuits VF2 are disposed between the voltage division output terminals out_1 to out_N and the corresponding switch sub-circuits s_1 to s_N, respectively, a high input impedance of the second voltage follower sub-circuit VF2 prevents the voltage divider circuit 1 from being affected by the comparator circuit 3, a low output impedance of the second voltage follower sub-circuit VF2 enhances the capability for driving the voltage isolation element, and the second voltage follower sub-circuit VF2 can function as a buffer between the voltage divider circuit 1 and the comparator circuit 3.

In some embodiments, the second voltage follower sub-circuit VF2 includes a second operational amplifier. The non-inverting input terminal of the second operational amplifier is electrically connected to the eighth input terminal of the second voltage follower sub-circuit VF2 including the second operational amplifier, the inverting input terminal of the second operational amplifier is electrically connected to the output terminal of the second operational amplifier, and the output terminal of the second operational amplifier is electrically connected to the second following voltage output terminal of the second voltage follower sub-circuit VF2 including the second operational amplifier.

It should be noted that the second voltage follower sub-circuit VF2 in the embodiments of the present disclosure may alternatively adopt other circuit structures with voltage follower functions, which will not be illustrated herein.

In addition, the voltage regulator circuit 4 may not be included in the sampling circuit shown in FIG. 7, which case is not illustrated by a corresponding drawing.

In the foregoing embodiments, the sampling circuit may further include a control circuit (not shown) connected to the switch sub-circuits s_1 to s_N. The control sub-circuit is configured to control the switch sub-circuits s_1 to s_N to be sequentially turned on according to a preset sequence, and at most one switch sub-circuit is in an on state at any moment. The preset sequence includes an ascending order of positions of the resistance voltage divider sub-circuits corresponding to the switch sub-circuits s_1 to s_N in the voltage divider circuit 1, or a descending order of the positions of the resistance voltage divider sub-circuits corresponding to the switch sub-circuits s_1 to s_N in the voltage divider circuit 1.

Based on the same inventive concept, an embodiment of the present disclosure further provides an optical detection system, including a light sensing circuit and a sampling circuit as provided in any one of the previous embodiments, wherein an output terminal of the light sensing circuit is electrically connected to the sampling voltage input terminal, and the light sensing circuit is configured to sense light and generate a corresponding sampling voltage according to intensity of the light. For the specific description of the sampling circuit, reference may be made to the corresponding contents in the foregoing embodiments, and details are not repeated herein.

Based on the same inventive concept, an embodiment of the present disclosure further provides a display apparatus, which includes the optical detection system provided in the foregoing embodiment. For the specific description of the optical detection system, reference may be made to the corresponding contents in the foregoing embodiments, and details are not repeated herein.

The display apparatus further includes a display panel. The light sensing circuit may include a thin film transistor structure having a light sensing function, which may be directly fabricated on a base substrate (e.g., a glass substrate or a flexible substrate) in the display panel through an array process.

The display apparatus in the embodiment of the present disclosure may be any product or component with a display function, such as a liquid crystal display, an electronic paper, a mobile phone, a tablet computer, a television, a notebook computer, a digital photo frame, a navigator or the like.

Figure 8:
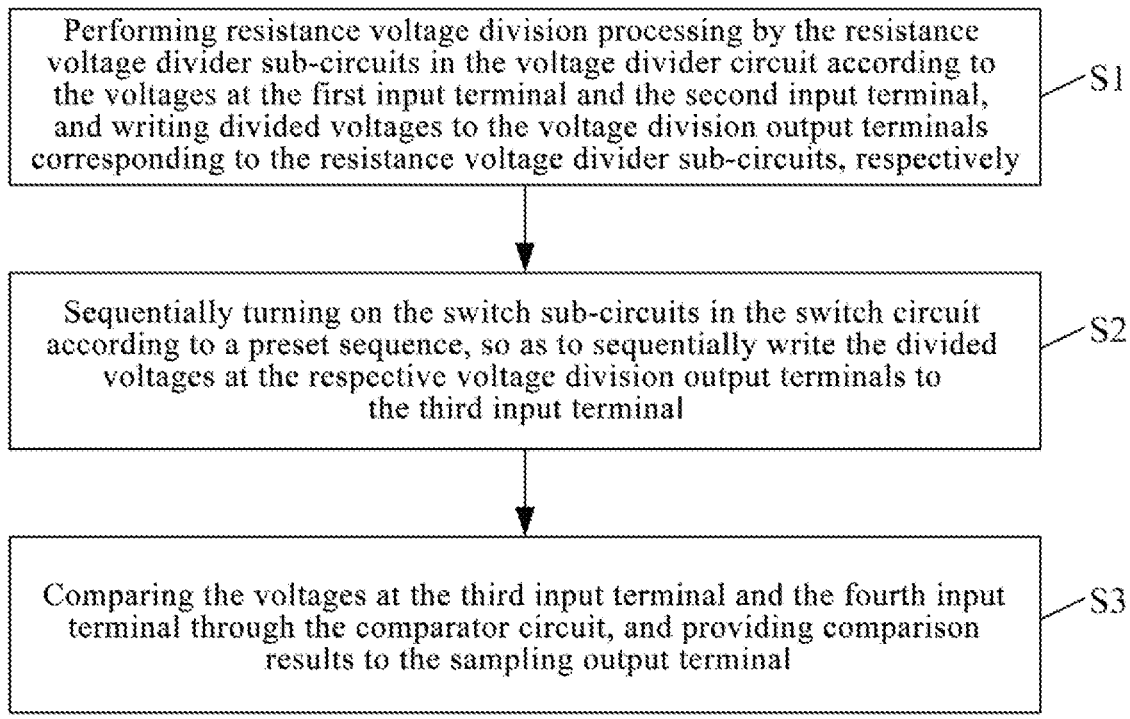
FIG. 8 is a flowchart of a sampling method provided in an embodiment of the present disclosure.

Based on the same inventive concept, the present disclosure further provides a sampling method. FIG. 8 is a flowchart of a sampling method provided in an embodiment of the present disclosure. As shown in FIG. 8, the sampling method is based on the sampling circuit provided in the previous embodiment, and includes:

Step S1, performing resistance voltage division processing by the resistance voltage divider sub-circuits in the voltage divider circuit according to the voltages at the first input terminal and the second input terminal, and writing divided voltages to the voltage division output terminals corresponding to the resistance voltage divider sub-circuits, respectively.

Step S2, sequentially turning on the switch sub-circuits in the switch circuit according to a preset sequence, so as to sequentially write the divided voltages at the respective voltage division output terminals to the third input terminal.

In some embodiments, the preset sequence includes an ascending order of positions of the resistance voltage divider sub-circuits corresponding to the switch sub-circuits in the voltage divider circuit, or a descending order of the positions of the resistance voltage divider sub-circuits corresponding to the switch sub-circuits in the voltage divider circuit 1.

Step S3, comparing the voltages at the third input terminal and the fourth input terminal through the comparator circuit, and providing comparison results to the sampling output terminal.

In some embodiments, the comparator circuit is specifically configured to output a first result when determining by comparison that a voltage at the third input terminal is equal to a voltage at the fourth input terminal, and to output a second result when determining by comparison that the voltage at the third input terminal is not equal to the voltage at the fourth input terminal. one of the first result and the second result is a high level signal (indicated by "1"), and the other of the first result and the second result is a low level signal (indicated by "0").

For the detailed description of the steps S1 to S3, reference may be made to the contents in the foregoing embodiments, and details are not repeated herein.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications also fall within the protection scope of the present disclosure.

What is claimed is:

1. A sampling circuit, configured with a sampling voltage input terminal, a reference voltage input terminal, and a sampling output, wherein the sampling circuit comprises a voltage divider circuit, a switch circuit and a comparator circuit, the voltage divider circuit is configured with a first input terminal, a second input terminal and a plurality of voltage division output terminals, the second input terminal is electrically connected to a first power supply terminal, and the comparator circuit is configured with a third input terminal and a fourth input terminal;

the voltage divider circuit comprises a plurality of resistance voltage divider sub-circuits sequentially connected in series between the first input terminal and the second input terminal and in a one-to-one correspondence with the plurality of voltage division output terminals, each of the plurality of resistance voltage divider sub-circuits is configured with a first terminal and a second terminal, the first terminal of a first resistance voltage divider sub-circuit in the plurality of resistance voltage divider sub-circuits is electrically connected to the first input terminal, the second terminal of a last resistance voltage divider sub-circuit in the plurality of resistance voltage divider sub-circuits is electrically connected to the second input terminal, the first terminals of the plurality of resistance voltage divider sub-circuits are electrically connected to the plurality of voltage division output terminals, respectively, and the plurality of resistance voltage divider sub-circuits are configured to perform resistance voltage division processing according to voltages at the first input terminal and the second input terminal and write divided voltages to the plurality of voltage division output terminals, respectively;

the switch circuit comprises a plurality of switch sub-circuits in a one-to-one correspondence with the plurality of voltage division output terminals, the plurality of voltage division output terminals are electrically connected to the third input terminal through the plurality of switch sub-circuits, respectively, and each of the plurality of switch sub-circuits is configured to control connection and disconnection between a corresponding voltage division output terminal in the plurality of voltage division output terminals and the third input terminal;

the comparator circuit is electrically connected to the sampling output terminal, and is configured to compare voltages at the third input terminal and the fourth input terminal and provide comparison results to the sampling output terminal; and one of the first input terminal and the fourth input terminal is electrically connected to the sampling voltage input terminal, and the other of the first input terminal and the fourth input terminal is electrically connected to the reference voltage input terminal.

2. The sampling circuit according to claim 1, further comprising a voltage regulator circuit, wherein the voltage regulator circuit comprises at least one voltage regulator sub-circuit; and each of the at least one voltage regulator sub-circuit is electrically connected to one of the plurality of voltage division output terminals except the voltage division output terminal corresponding to the first resistance voltage divider sub-circuit, and the voltage regulator sub-circuit is configured to perform voltage stabilization processing on a voltage at the voltage division output terminal electrically connected to the voltage regulator sub-circuit.

3. The sampling circuit according to claim 2, wherein the voltage regulator circuit is configured with a fifth input terminal electrically connected to the first input terminal and a sixth input terminal electrically connected to the second input terminal;

the voltage regulator circuit further comprises a first voltage division resistor, the at least one voltage regulator sub-circuit comprises at least one second voltage division resistor, respectively, the first voltage division resistor and the at least one second voltage division resistor are sequentially connected in series between the fifth input terminal and the sixth output terminal, each the first voltage division resistor and the second voltage division resistor is configured with a first terminal and a second terminal, the first terminal of the first voltage division resistor is electrically connected to the fifth input terminal, and the second terminal of a last second voltage division resistor in the at least one second voltage division resistor is electrically connected to the sixth input terminal; and the first terminal of the second voltage division resistor is electrically connected to the voltage division output terminal corresponding to the voltage regulator sub-circuit comprising the second voltage division resistor.

4. The sampling circuit according to claim 3, wherein the voltage regulator sub-circuit further comprises a first voltage follower sub-circuit, the first terminal of the second voltage division resistor is electrically connected to the voltage division output terminal corresponding to the voltage regulator sub-circuit comprising the second voltage division resistor through the first voltage follower sub-circuit; and the first voltage follower sub-circuit is configured with a seventh input terminal and a first following voltage output terminal, the seventh input terminal is electrically connected to the first terminal of the second voltage division resistor, and the first following voltage output terminal is electrically connected to the voltage division output terminal.

5. The sampling circuit according to claim 4, wherein the first voltage follower sub-circuit comprises a first operational amplifier, a non-inverting input terminal of the first operational amplifier is electrically connected to the seventh input terminal of the first voltage follower sub-circuit, an inverting input terminal of the first operational amplifier is electrically connected to an output terminal of the first operational amplifier, and the output terminal of the first operational amplifier is electrically connected to the first following voltage output terminal of the first voltage follower sub-circuit comprising the first operational amplifier.

6. The sampling circuit according to claim 3, wherein the at least one voltage regulator sub-circuit in the voltage regulator circuit comprises Q number of voltage regulator sub-circuits, the plurality of resistance voltage divider sub-circuits in the voltage divider circuit comprise N number of resistance voltage divider sub-circuits, a $q^{th}$ voltage regulator sub-circuit in the voltage regulator circuit is electrically connected to the voltage division output terminal corresponding to an $n^{th}$ resistance voltage divider sub-circuit in the voltage divider circuit, q is greater than or equal to 1 and less than or equal to Q, n is greater than or equal to 2 and less than or equal to N, and q and n are all integers;

each of the plurality of resistance voltage divider sub-circuits comprises a third voltage division resistor;

the first voltage division resistor and the second voltage division resistors in the voltage regulator circuit, and the third voltage division resistors in the voltage divider circuit satisfy:

$$\frac{\sum_{i=q}^{Q} R\_i}{\sum_{i=1}^{Q} R\_i + R\_0} = \frac{\sum_{j=n}^{N} r\_j}{\sum_{j=1}^{N} r\_j}, \text{ and}$$

$$\sum_{i=q}^{Q} R\_i < \sum_{j=n}^{N} r\_j,$$

wherein R_i indicates a resistance value of the second voltage division resistor in an $i^{th}$ voltage regulator sub-circuit in the voltage regulator circuit, R_0 indicates a resistance value of the first voltage division resistor in the voltage regulator circuit, r_j indicates a resistance value of the third voltage division resistor in an $j^{th}$ voltage division sub-circuit in the voltage divider circuit, and i and j are all positive integers.

7. The sampling circuit according to claim 3, wherein the first voltage division resistor is a variable resistor.

8. The sampling circuit according to claim 1, further comprising a plurality of second voltage follower sub-circuits, wherein each of the plurality of second voltage follower sub-circuits is between one of the plurality of voltage division output terminals and the switch sub-circuit corresponding to the voltage division output terminal, and the second voltage follower sub-circuit is configured with an eighth input terminal electrically connected to the voltage division output terminal and a second following voltage output terminal electrically connected to the switch sub-circuit.

9. The sampling circuit according to claim 8, wherein the second voltage follower sub-circuit comprises a second operational amplifier, a non-inverting input terminal of the second operational amplifier is electrically connected to the eighth input terminal of the second voltage follower sub-circuit, an inverting input terminal of the second operational amplifier is electrically connected to an output terminal of the second operational amplifier, and the output terminal of the second operational amplifier is electrically connected to the second following voltage output terminal of the second voltage follower sub-circuit comprising the second operational amplifier.

10. The sampling circuit according to claim 1, wherein each of the plurality of resistance voltage divider sub-circuits comprises a third voltage division resistor; and the third voltage division resistor in at least one of the plurality of resistance voltage divider sub-circuits in the voltage divider circuit is a variable resistor.

11. The sampling circuit according to claim 10, wherein the third voltage division resistor in the first resistance voltage divider sub-circuit is a variable resistor.

12. The sampling circuit according to claim 1, further comprising a control circuit, wherein the control circuit is connected to the plurality of switch sub-circuits;

the control sub-circuit is configured to control the plurality of switch sub-circuits to be sequentially turned on according to a preset sequence, and at most one switch sub-circuit in the plurality of switch sub-circuits is turned on at any moment; and the preset sequence comprises an ascending order of positions of the resistance voltage divider sub-circuits corresponding to the switch sub-circuits, in the voltage divider circuit, or a descending order of the positions of the resistance voltage divider sub-circuits corresponding to the switch sub-circuits, in the voltage divider circuit.

13. The sampling circuit according to claim 1, wherein the comparator circuit is configured to output a first result when determining by comparison that a voltage at the third input terminal is equal to a voltage at the fourth input terminal, and to output a second result when determining by comparison that the voltage at the third input terminal is not equal to the voltage at the fourth input terminal; and one of the first result and the second result is a high level signal, and the other of the first result and the second result is a low level signal.

14. An optical detection system, comprising a light sensing circuit and the sampling circuit according to claim 1, wherein an output terminal of the light sensing circuit is electrically connected to the sampling voltage input terminal, and the light sensing circuit is configured to sense light and generate a corresponding sampling voltage according to intensity of the light.

15. A display apparatus, comprising the optical detection system according to claim 14.

16. A sampling method based on the sampling circuit according to claim 1, wherein the sampling method comprises:

performing resistance voltage division processing by the plurality of resistance voltage divider sub-circuits in the voltage divider circuit according to the voltages at the first input terminal and the second input terminal, and writing divided voltages to the plurality of voltage division output terminals, respectively;

sequentially turning on the plurality of switch sub-circuits in the switch circuit according to a preset sequence, so as to sequentially write the divided voltages at the plurality of voltage division output terminals to the third input terminal; and comparing the voltages at the third input terminal and the fourth input terminal through the comparator circuit, and providing comparison results to the sampling output terminal;

wherein the preset sequence comprises an ascending order of positions of the resistance voltage divider sub-circuits corresponding to the switch sub-circuits, in the voltage divider circuit, or a descending order of the positions of the resistance voltage divider sub-circuits corresponding to the switch sub-circuits, in the voltage divider circuit.

17. The sampling circuit according to claim 10, wherein the third voltage division resistor in the last resistance voltage divider sub-circuit is a variable resistor.

18. The sampling circuit according to claim 11, wherein the third voltage division resistor in the last resistance voltage divider sub-circuit is a variable resistor.

19. An optical detection system, comprising a light sensing circuit and the sampling circuit according to claim 2, wherein an output terminal of the light sensing circuit is electrically connected to the sampling voltage input terminal, and the light sensing circuit is configured to sense light and generate a corresponding sampling voltage according to intensity of the light.

20. An optical detection system, comprising a light sensing circuit and the sampling circuit according to claim 3, wherein an output terminal of the light sensing circuit is electrically connected to the sampling voltage input terminal, and the light sensing circuit is configured to sense light and generate a corresponding sampling voltage according to intensity of the light.

* * * * *